United States Patent
Lau et al.

(10) Patent No.: US 9,313,926 B2
(45) Date of Patent: *Apr. 12, 2016

(54) COOLING HEAT-GENERATING ELECTRONICS

(71) Applicant: Google Inc., Mountain View, CA (US)

(72) Inventors: Michael Chi Kin Lau, San Francisco, CA (US); Richard C. Bruns, San Francisco, CA (US); Melanie Beauchemin, Mountain View, CA (US)

(73) Assignee: Google Inc., Mountain View, CA (US)

( * ) Notice: Subject to any disclaimer, the term of this patent is extended or adjusted under 35 U.S.C. 154(b) by 92 days.

This patent is subject to a terminal disclaimer.

(21) Appl. No.: 14/171,510

(22) Filed: Feb. 3, 2014

(65) Prior Publication Data

US 2014/0146466 A1 May 29, 2014

Related U.S. Application Data

(63) Continuation of application No. 12/957,855, filed on Dec. 1, 2010, now Pat. No. 8,644,020.

(51) Int. Cl.
*H05K 7/20* (2006.01)
*H01L 23/427* (2006.01)
*H01L 23/467* (2006.01)

(52) U.S. Cl.
CPC .......... *H05K 7/20718* (2013.01); *H01L 23/427* (2013.01); *H05K 7/20336* (2013.01);
(Continued)

(58) Field of Classification Search
CPC .......... H05K 7/208–7/20809; H05K 7/20336; H01L 23/427
USPC .............. 361/679.46–679.54, 688–727; 165/80.4–80.5, 104.33; 257/714–715; 174/15.2, 547, 252
See application file for complete search history.

(56) References Cited

U.S. PATENT DOCUMENTS 6,804,117 B2  10/2004  Phillips
6,972,365 B2  12/2005  Garner
(Continued)

FOREIGN PATENT DOCUMENTS

CN   201142047    10/2008
EP    2170030 B1   9/2012

OTHER PUBLICATIONS

Search Report in European Application No. 14160571.7, mailed Jul. 8, 2014, 3 pages.
(Continued)

*Primary Examiner* — Zachary M Pape
(74) *Attorney, Agent, or Firm* — Fish & Richardson P.C.

(57) ABSTRACT

A server rack sub-assembly includes at least one motherboard having a perimeter; a plurality of heat-generating electronic devices mounted on the motherboard in an area of the motherboard thermally decoupled from the motherboard perimeter; one or more brackets including heat transfer surfaces and attached to the motherboard along at least a portion of the motherboard perimeter; and a heat transfer device thermally coupled to the area of the motherboard that is thermally decoupled from the motherboard perimeter and the one or more brackets. The one or more brackets are adapted to receive a cooling airflow circulated over the bracket and to convectively transfer heat into the cooling airflow and are further adapted to couple the motherboard to a server rack assembly. The heat transfer device is arranged to conductively transfer heat from the one or more electronic devices to the brackets.

19 Claims, 6 Drawing Sheets

(52) U.S. Cl.
CPC ........ *H05K7/20445* (2013.01); *H05K 7/20727* (2013.01); *H05K 7/20809* (2013.01); *H01L 23/467* (2013.01); *H01L 2924/0002* (2013.01); *H05K 7/20163* (2013.01)

(56) References Cited

U.S. PATENT DOCUMENTS

| | | | | |
|---|---|---|---|---|
| 7,025,129 | B2* | 4/2006 | Chiu | 165/185 |
| 7,397,662 | B2* | 7/2008 | Oyamada | 361/699 |
| 7,403,384 | B2 | 7/2008 | Pflueger | |
| 7,719,837 | B2 | 5/2010 | Wu | |
| 8,031,464 | B2 | 10/2011 | Adkins | |
| 8,077,463 | B2 | 12/2011 | Lee | |
| 8,644,020 | B2* | 2/2014 | Lau et al. | 361/679.47 |
| 2003/0128516 | A1 | 7/2003 | Faneuf | |
| 2006/0005980 | A1 | 1/2006 | Garner | |
| 2007/0042514 | A1 | 2/2007 | Wu | |
| 2007/0097634 | A1 | 5/2007 | Chang | |
| 2007/0263355 | A1 | 11/2007 | Yu | |
| 2008/0013283 | A1 | 1/2008 | Gilbert | |
| 2008/0043442 | A1 | 2/2008 | Strickland | |
| 2008/0055848 | A1 | 3/2008 | Hamburgen | |
| 2009/0021908 | A1* | 1/2009 | Patel et al. | 361/688 |
| 2009/0027856 | A1 | 1/2009 | McCoy | |
| 2009/0284924 | A1* | 11/2009 | Konshak et al. | 361/700 |
| 2011/0182033 | A1 | 7/2011 | Tissot | |

OTHER PUBLICATIONS

Richard M. Russell, "The CRAY-1 Computer System" Communications of the ACM, vol. 21, No. 1, Jan. 1978, pp. 63-72.
James S. Kolodzey, "CRAY-1 Computer Technology" IEEE Transactions on Components, Hybrids, and Manufacturing Technology, vol. CHMT-4, No. 2, Jun. 1981, pp. 181-186.
Austin Modine, "Remembering the CRAY-1 When Computers and Furniture Collide" The Register, http://www.theregister.co.uk/2008/01/05/tob_cray1/print.html, Sep. 8, 2010, 7 pages.
Andie Hioki, "The Cray-1 Supercomputer" http://www.openloop.com/education/classes/sjsu_engr/engr_compOrg/spring2002/studentPr . . . , San Jose State University, Sep. 8, 2010, 16 pages.
International Search Report and Written Opinion for Application No. PCT/US2011/062907, dated Apr. 5, 2012, 11 pages.
International Preliminary Report on Patentability for Application No. PCT/US2011/062907, dated Jun. 13, 2013, 7 pages.
Office Action issued in Chinese Application No. 201180065948.X on Mar. 25, 2015, 20 pages (with English translation).

* cited by examiner

COOLING HEAT-GENERATING ELECTRONICS

CROSS-REFERENCE TO RELATED APPLICATION

This application is a continuation of, and claims priority under 35 U.S.C. §120 to, U.S. patent application Ser. No. 12/957,855, entitled "COOLING HEAT-GENERATING ELECTRONICS," filed on Dec. 1, 2010, the entire contents of which are incorporated by reference in their entirety herein.

TECHNICAL BACKGROUND

This disclosure relates to systems and methods for providing cooling for electronic equipment and, more particularly, to systems and methods for cooling electronic devices on server racks in computer data centers.

BACKGROUND

Computer users often focus on the speed of computer microprocessors (e.g., megahertz and gigahertz). Many forget that this speed often comes with a cost—higher power consumption. For one or two home PCs, this extra power may be negligible when compared to the cost of running the many other electrical appliances in a home. But in data center applications, where thousands of microprocessors may be operated, electrical power requirements can be very important.

Power consumption and electronics operation may also generate heat. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand (or tens of thousands) to account for the many computers in a large data center, and one can readily appreciate the amount of heat that can be generated. The effects of power consumed by the critical load in the data center are often compounded when one incorporates all of the ancillary equipment required to support the critical load.

Many techniques may be used to cool electronic devices (e.g., processors, memories, and other heat generating devices) that are located on a server rack tray. For instance, forced convection may be created by providing a cooling airflow over the devices. Fans located near the devices, fans located in computer server rooms, and/or fans located in ductwork in fluid communication with the air surrounding the electronic devices, may force the cooling airflow over the tray containing the devices. In some instances, one or more components or devices on a server tray may be located in a difficult-to-cool area of the tray; for example, an area where forced convection is not particularly effective or not available.

The consequence of inadequate and/or insufficient cooling may be the failure of one or more electronic devices on the tray due to a temperature of the device exceeding a maximum rated temperature. While certain redundancies may be built into a computer data center, a server rack, and even individual trays, the failure of devices due to overheating can come at a great cost in terms of speed, efficiency, and expense.

SUMMARY

In one general implementation, a server rack sub-assembly includes: at least one motherboard having a perimeter; a plurality of heat-generating electronic devices mounted on the motherboard in an area of the motherboard thermally decoupled from the motherboard perimeter; one or more brackets including heat transfer surfaces and attached to the motherboard along at least a portion of the motherboard perimeter; and a heat transfer device thermally coupled to the area of the motherboard that is thermally decoupled from the motherboard perimeter and the one or more brackets. The one or more brackets are adapted to receive a cooling airflow circulated over the bracket and to convectively transfer heat into the cooling airflow and are further adapted to couple the motherboard to a server rack assembly. The heat transfer device is arranged to conductively transfer heat from the one or more electronic devices to the brackets.

In another general implementation, a method for cooling electronic equipment, includes: providing at least one server rack sub-assembly having at least one motherboard and one or more brackets coupled to the motherboard along at least a portion of a perimeter of the motherboard, where the one or more brackets are adapted to couple the motherboard to a server rack assembly and the motherboard includes a plurality of heat-generating computing devices mounted on the motherboard in an area thermally decoupled from the perimeter; circulating a cooling airflow directed over the one or more brackets adjacent the perimeter; conductively transferring heat generated by the plurality of computing devices mounted on the thermally decoupled area to the one or more brackets; and convectively transferring the generated heat from the one or more brackets to the cooling airflow.

In another general implementation, a system includes a server rack assembly including two or more server rack sub-assemblies and one or more fans. At least one of the server rack sub-assemblies includes at least one motherboard having of the server rack sub-assembly; a plurality of heat-generating electronic devices mounted on the motherboard in an area of the motherboard thermally decoupled from the motherboard perimeter; one or more brackets coupling the server rack sub-assembly to the server rack assembly, where the one or more brackets include heat transfer surfaces and attached to the motherboard along at least a portion of the motherboard perimeter; and a heat pipe thermally coupled to the area of the motherboard that is thermally decoupled from the motherboard perimeter, where the heat pipe is arranged to conductively transfer heat from the one or more electronic devices to the one or more brackets. The fans are adapted to circulate cooling air over the heat transfer surfaces to convect heat away from the area of the motherboard that is thermally decoupled from the motherboard perimeter and the one or more brackets.

In one or more specific aspects of one or more of the general implementations, a server rack sub-assembly may further include a heat sink mounted on the motherboard in the area of the motherboard thermally decoupled from the motherboard perimeter, the heat sink thermally coupled to the area of the motherboard and the heat transfer device.

In one or more specific aspects of one or more of the general implementations, at least a portion of the heat sink may include the one or more brackets.

In one or more specific aspects of one or more of the general implementations, a heat sink may include a thermal interface between at least a portion of the plurality of heat-generating electronic devices and a planar portion of the heat sink, where the thermal interface is adapted to increase contact between the portion of the plurality of heat-generating electronic devices and heat sink as a temperature of the heat sink increases.

In one or more specific aspects of one or more of the general implementations, the thermal interface may include a phase-change material enclosed against the planar portion of the heat sink by a film, where the phase-change material is adapted to change from a substantially solid material to a semi-solid or liquid material as the temperature of the heat sink increases.

In one or more specific aspects of one or more of the general implementations, the changed phase-change material may substantially fill an air gap between the portion of the plurality of heat-generating electronic devices and the heat sink.

In one or more specific aspects of one or more of the general implementations, the changed phase-change material may substantially fill an air gap between the motherboard and the heat sink.

In one or more specific aspects of one or more of the general implementations, a heat transfer device may include a heat pipe enclosing a working material.

In one or more specific aspects of one or more of the general implementations, the heat pipe may further include an evaporator and at least one condenser, where the evaporator is thermally coupled to the area of the motherboard thermally decoupled from the perimeter, the condenser thermally coupled to one or more of the brackets.

In one or more specific aspects of one or more of the general implementations, the working material may be adapted to receive the heat generated by the electronic devices and transfer the heat to the one or more brackets.

In one or more specific aspects of one or more of the general implementations, the heat transfer device may include a mesh thermally coupled to the area of the motherboard that is thermally decoupled from the perimeter and at least one of the brackets.

In one or more specific aspects of one or more of the general implementations, the heat sink may further include one or more fins extending from a planar portion of the heat sink, where the mesh is coupled to the heat sink over the fins such that the mesh and the heat sink are in thermal contact.

In one or more specific aspects of one or more of the general implementations, the mesh may include one or more wings extending from a substantially planar portion of the mesh, where the wings are adapted to thermally communicate heat from the planar portion of the mesh to at least one of the brackets.

In one or more specific aspects of one or more of the general implementations, the one or more brackets may be adapted to couple at least three motherboards to the server rack assembly.

One or more specific aspects of one or more of the general implementations may also include conductively transferring heat generated by the plurality of computing devices mounted on the thermally decoupled area to a heat sink mounted on the motherboard in the area thermally decoupled from the perimeter; and conductively transferring the heat from the heat sink to the brackets.

One or more specific aspects of one or more of the general implementations may also include conductively transferring heat generated by the plurality of computing devices mounted on the thermally decoupled area to the heat sink through a thermal interface between the heat sink and the motherboard, where the thermal interface includes a phase-change material.

In one or more specific aspects of one or more of the general implementations, conductively transferring heat generated by the plurality of computing devices mounted on the thermally decoupled area to the one or more brackets may include conductively transferring heat generated by the plurality of computing devices mounted on the thermally decoupled area to the one or more brackets with a heat pipe thermally coupled to the motherboard and the one or more brackets, where the heat pipe includes a working material enclosed in an evaporator in fluid communication with a condenser.

One or more specific aspects of one or more of the general implementations may also include transferring the generated heat from the plurality of computing devices mounted on the thermally decoupled area to the working material within the evaporator; and transferring the generated heat from the working material to the one or more brackets.

In one or more specific aspects of one or more of the general implementations, conductively transferring heat generated by the plurality of computing devices mounted on the thermally decoupled area to the perimeter may include conductively transferring heat generated by the plurality of computing devices mounted on the thermally decoupled area to the perimeter with a mesh thermally coupled to the motherboard and the perimeter, where the mesh includes a plurality of apertures and one or more wings.

One or more specific aspects of one or more of the general implementations may also include coupling the mesh to the heat sink by sliding the plurality of apertures over corresponding fins mounted on the heat sink; and coupling each wing to a corresponding bracket adjacent the perimeter.

One or more specific aspects of one or more of the general implementations may also include conductively transferring the generated heat from the plurality of computing devices mounted on the thermally decoupled area through the wing and to the corresponding bracket.

In one or more specific aspects of one or more of the general implementations, a system may further include a heat sink thermally coupled between the area of the motherboard thermally decoupled from the motherboard perimeter and the heat pipe.

In one or more specific aspects of one or more of the general implementations, at least one of the one or more fans is mounted on the server rack assembly.

In one or more specific aspects of one or more of the general implementations, the one or more fans may not circulate air over the area of the motherboard thermally decoupled from the motherboard perimeter.

Various implementations of a server rack tray assembly according to the present disclosure may include one or more of the following features and/or advantages. For example, the tray assembly may allow for more effective convection cooling by relocating heat generated by electronics devices to an area with a cooling airflow over or by the tray assembly. The tray assembly may also provide for cooling of heat generating devices on the tray through conductive transfer away from a hard-to-cool area of the tray. The tray assembly may also mix conductive and convective cooling techniques to whisk heat away from hard-to-cool areas of the tray. As another example, the tray assembly may help prevent failures, and even catastrophic failures, of one or more electronic devices due to overheating even with little to no significant airflow around the devices. The tray assembly may use conductive and convective heat transfer techniques in series and/or parallel heat transfer operations to cool devices that are provided with little to no airflow. The tray assembly may also use radiative heat transfer techniques to dissipate heat generated by devices that are provided with little to no airflow.

Various implementations of a server rack tray assembly according to the present disclosure may also include one or more of the following features and/or advantages. For example, the tray assembly may provide for a plug-in thermal solution (or thermal transfer system) that communicates some or all of the heat generated by one or more heat-generating components from a vicinity with limited or no forced convection to a vicinity with substantial forced convection. For instance, the heat may be communicated to a more favorable location on the tray assembly if forced convection is not available or limited in the vicinity of the one or more components. Further, the tray assembly may communicate heat to the vicinity that experiences forced air convection depending on the degree to which the components experience air convection. As one example, if the components experience air convection, the plug-in thermal solution may function similar to a traditional heat sink device, in which the heat generated by the components is transferred to the air (e.g., by one or more fins of the thermal solution). However, if there is no airflow (natural convection) near or over the components, the majority of the heat may be transported to a more favorable location (e.g., brackets or tray sides) where forced convection is available. In addition, if there is no airflow (natural convection) near or over the components, the majority of the heat may be transported to a more favorable location (e.g., brackets or tray sides) where natural convection is available These general and specific aspects may be implemented using a device, system or method, or any combinations of devices, systems, or methods. The details of one or more implementations are set forth in the accompanying drawings and the description below. Other features, objects, and advantages will be apparent from the description and drawings, and from the claims.

DETAILED DESCRIPTION

This document discusses cooling devices that may be implemented as heat sinks for computing equipment, and that may be used to remove heat from the vicinity of the components that are generating the heat, so as to prevent overheating and subsequent failure of the equipment. In some implementations, a thermal transfer system may be mounted on, or integrated with, a server rack assembly for a server rack. In addition, the thermal transfer system may be mounted on circuit card assemblies, daughter cards, and/or other electronic circuit supporting devices. A server rack sub-assembly may contain or support a number of heat-generating electronic devices used to facilitate data communication, storage, processing, or otherwise. Some devices of this type may be located on a motherboard (e.g. printed circuit board (PCB)) in a first area in that does not receive circulation of cooling airflow. Other such devices can be located on the motherboard in a second area that receives minimal cooling airflow. In contrast, a third area of the motherboard and/or server rack sub-assembly to which the motherboard is coupled may receive a comparatively much more substantial amount or rate of cooling airflow. Thus, portions of the motherboard and/or server rack sub-assembly may experience a convective heat transfer effect while other portions may not. In some implementations, a heat transfer device may be thermally coupled to the first and/or second areas and to the third area such that heat generated by the electronic devices is conductively and/or convectively transferred from the first and second areas to the third area. Thus, heat generated by devices on the motherboard over which minimal or no cooling airflow is circulated may be transferred to a location over which cooling airflow is circulated.

Figure 1:
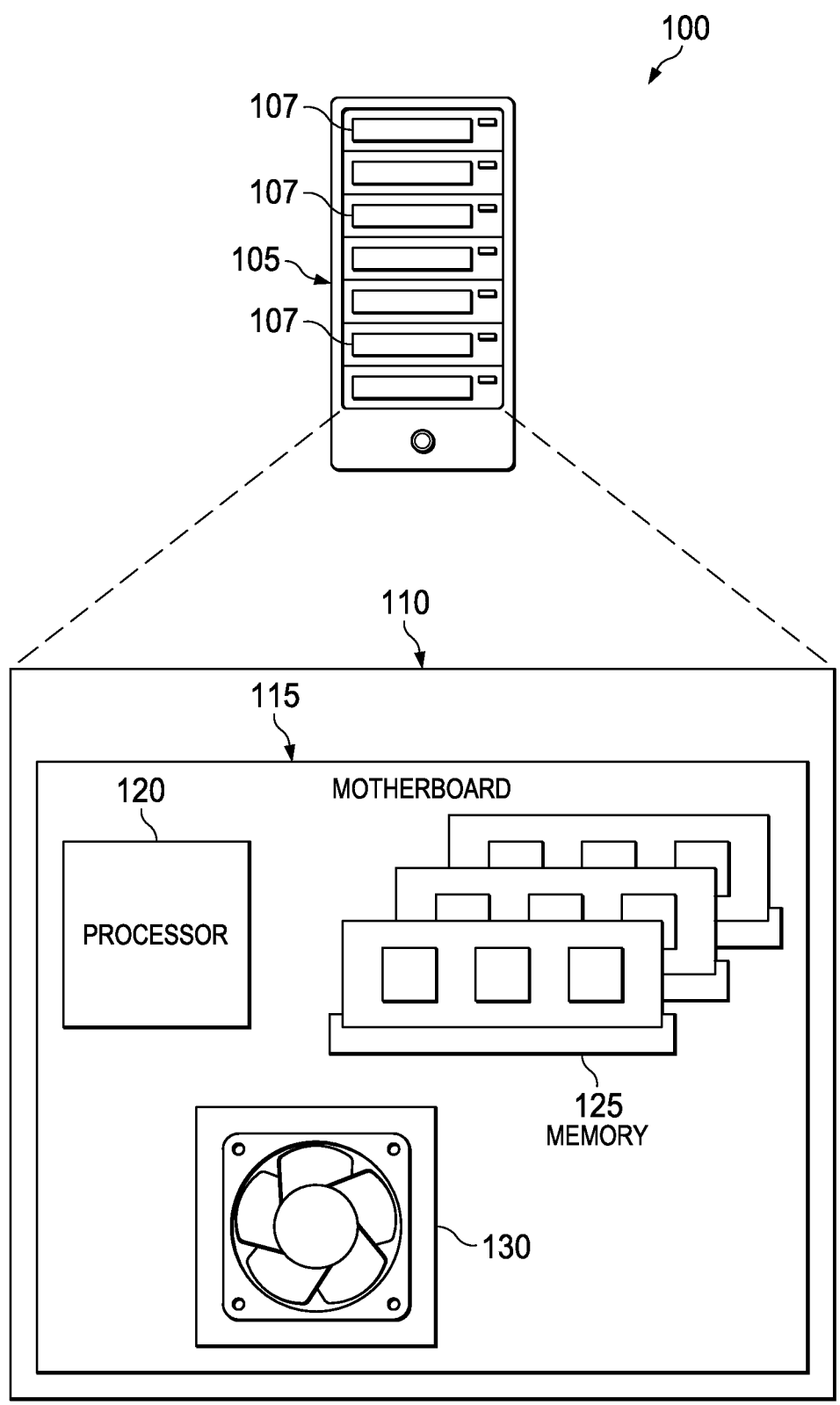
FIG. 1 illustrates a server rack and an example server rack assembly configured to mount within the rack, including one or more heat generating devices in accordance with the present disclosure.

FIG. 1 illustrates an example system 100 that includes a server rack 105 and an example server rack assembly 110 configured to mount within the rack 105, where the server rack assembly 110 houses one or more heat generating devices. The server rack assembly 110 may simply be a flat structure onto which a motherboard may be placed and mounted, so that the assembly 110 may be grasped by technicians for moving the motherboard into place and holding it in position within the rack 105. In certain implementations, the server rack sub-assembly 110 may be modified (e.g., by implementing it as a peripheral frame around the motherboard) or may be eliminated so that the motherboard itself is located in the rack 105.

The server rack assembly 110 may be a variety of server structures. For example, in some implementations, the server rack assembly 110 may be a "tray" or tray assembly that can be slidingly inserted into the server rack 105. A tray can be a flat component with or without a lip or raised edge on one or more edges of the tray. In addition, in some implementations, the server rack assembly 110 may include multiple sub-assemblies (such as server rack sub-assemblies 200 and 300 described below) on a single tray. Alternatively, in some implementations, the server rack assembly 110 may be a hard drive cage. Alternatively, in some implementations, the server rack assembly 110 may be a server chassis, or server container (e.g., server box).

For the purposes of the present disclosure, the term "tray" is not limited to any particular arrangement, but instead applies to motherboard or other relatively flat structures appurtenant to a motherboard for supporting the motherboard in position in a rack structure. Trays may be generally mounted parallel to other trays in a horizontal or vertical stack, so as to permit denser packing than would otherwise be possible with computers having free-standing housings and other components. The term "blade" may also be employed to refer to such apparatuses, though that term too should not be limited to a particular arrangement. Trays may be implemented in particular configurations, including as support for computer servers, switches (e.g., electrical and optical), routers, drives or groups of drives, and other computing-related devices. In general, the trays in a system take a standardized physical and electrical form so that they will be easily interchangeable from one location in the system to another, but the trays may take other appropriate forms.

Although a single server rack 105 is illustrated, server rack 105 may be one of a number of server racks within the system 100, which may include a server farm or a co-location facility that contains various rack mounted computer systems. Generally, the server rack 105 defines multiple slots 107 that are arranged in an orderly and repeating fashion within the server rack 105, such as the illustrated horizontal arrangement, and may each receive one or more server rack assemblies 110 therein. Each slot 107 is a space in the rack into which a correspond tray or trays may be placed and removed. The slots 107 may be formed, for example, by attaching angle iron pieces (or sheetmetal forms of the rack skin) on opposed lateral sides of the inner part of a rack frame at matched heights on each side, so as to create small shelves over which the trays may be slid and supported. Alternatively, the slots 107 may be vertically stacked and receive one or more server rack assemblies 110 mounted in the server rack 105 via mounting rails or other suitable mechanisms. Each slot 107 may contain or include any number of server rack assemblies 110 and, typically, may enclose a number of computer components such as central processing units (CPUs), memory, disk drives, power supplies, input/output cards and interfaces, cooling hardware, and other computing devices.

Server rack 105, as part of a larger data center for instance, may provide data processing and storage capacity. In operation, a data center may be connected to a network, and may receive and respond to various requests from the network to retrieve, process, and/or store data. In operation, for example, the server rack 105 typically facilitates the communication of information over a network with user interfaces generated by web browser applications of users who request services provided by applications running on computers in the datacenter. For example, the server rack 105 may provide or help provide a user who is using a web browser to access web sites on the Internet or the World Wide Web.

Each server rack 105 may house one or more server rack assemblies 110. An example implementation of a server rack assembly 110 is illustrated in FIG. 1. The server rack assembly 110 may be mounted flat horizontally in the server rack 105 such as by sliding server rack assembly 110 into a slot 107 of the server rack 105 from the rack front. A technician would be standing in a aisle that runs across the front of a long row of racks. The server rack assembly 110 can rest on a pair of rails in the rack 105 located on opposed sides of the server rack assembly 110—much like sliding a lunch tray into a cafeteria rack, or a tray into a bread rack. Server assembly 110 may alternatively be mounted vertically, such as in a bank of trays mounted at one level in the server rack 105. The front of the server rack 105 may be kept open to an aisle or workspace during its normal operation (where cooling air may be drawn from the aisle during operation) to permit easy access to, and replacement of, trays and to permit for air to flow over the server rack assembly 110 from the workspace where technicians or other professionals operating a data center may be located. The term workspace refers to areas in which technicians or others may normally be located to work on computers in a data center.

As one example, the server rack assembly 110 may include a sub-assembly mounted on the server rack assembly 110. The sub-assembly may include a circuit board containing one or more heat generating devices. Thus, different or additional sub-assemblies may replace or be added to the server rack assembly 110 as, for example, the operation of the server rack 105 may dictate. For example, a particular server rack assembly 110 may be retrofit with a sub-assembly including a thermal transfer system (as described below for instance), replacing an existing sub-assembly that did not include the thermal transfer system. Accordingly, the retrofitted server rack assembly 110 may be able to address problems associated with heat generated by the computing devices on the sub-assembly better than a more conventional server rack assembly 110/sub-assembly combination.

The illustrated server rack assembly 110 houses a motherboard 115 on which a variety of components are mounted. Although one motherboard 115 is illustrated as mounted on server rack assembly 110, multiple motherboards may be mounted on each server rack assembly 110 according to the particular application. In some aspects, the motherboard 115 may be arranged so that air enters at its front edge (at the bottom in the illustrated board 115), is routed over a number of heat generating components on the board 115, and is exhausted from the server rack assembly 110.

In the illustrated implementation, at least one processor 120 and one or more memories 125 may be mounted on the motherboard 115. But in various implementations, the motherboard 115 may include two, three, four, or any other practicable number of processors 120. In some implementations, the motherboard 115 may be replaced with a tray of data storage devices (e.g., hard disc drives, flash memory, RAM, or any of these or other types of memory in combination). In various implementations, the processor 120 may include any combination of analog and/or digital logic circuits, which may be integrated or discrete, and may further include programmable and/or programmed devices that may execute instructions stored in a memory, such as the memory 125.

The memory or memories 125 may include volatile and/or non-volatile memory that may be read and/or written to by the processor 120. For example, the memory 125 may be in the form of a number of single in-line memory modules (SIMMs), dual in-line memory module (DIMMs), or other appropriate form. Other components of the computer system, such as chip sets and other chips, have been omitted for clarity in the figure, and may be selected and arranged in any appropriate manner. For instance, the board 115 may also be provided with connections to other devices, such as a network jack in the form of an RJ-45 jack or an optical networking connection. Other connections (e.g., besides power connections or other heat generating connections) may also be provided, such as other optical networking connections, video output connections, and input connections such as keyboard or pointing device connections (not shown).

Typically, in operation of the processor 120, memories 125, and other computing devices mounted on the motherboard 115 (not shown in FIG. 1), heat may be generated through inefficiencies of such devices and illustrated components on the board 115. In some implementations, a fan 130 (or multiple fans 130) may also be arranged to push or pull cooling air over or past one or more of the processor 120, memory 125, and/or other computing devices mounted on the motherboard 115. For example, the fan 130 may be mounted on a front side of the board 115 or may be mounted to the server rack assembly 110, and may push cooling air over such components. Alternatively, the fan 130 may be mounted at a back edge of the motherboard 115 (or server rack assembly 110) and exhaust air warmed by the illustrated components and other computing devices out of the server rack assembly 110 and/or out of the server rack 105. In other implementations, the fan 130 or multiple fans may be arranged to facilitate a cross-flow of cooling air across the motherboard 115 (e.g., from left-to-right, or right-to-left, as opposed to front-to-back or back-to-front) to dissipate heat generated by the processor 120, memory 125, and/or other heat-generating components.

In some implementations, the cooling air may include ambient air drawn from a human-occupiable workspace that is then routed over the motherboard 115 by the fan 130 or other air moving device. Alternatively, the cooling air may be ambient air that has been mechanically cooled (e.g., through a cooling coil, by evaporative cooling, or other cooling techniques) before being drawn over the motherboard 115. In any event, in order to avoid device failure of one or more of the processor 120, memory 125, and/or other computing devices on board 115 due to overheating, cooling fluid, such as cold or ambient air, may be provided over the motherboard 115 by the fan 130, other air moving device, natural convective airflows through the server rack 105, and/or a combination thereof.

In some implementations, the motherboard 115 and/or server rack assembly 110 may not include fan 130 or any air moving device mounted thereon. For instance, one or more fans located elsewhere in system 100, such as exhaust fans located in ductwork, supply fans located in computer-room air conditioners (CRACs), fan coil units, warm-air plenums, or other air handling equipment, may circulate cooling air over at least a portion of the board 115 (and may in certain implementations supplement fans mounted on the boards or trays). In some implementations, the board 115 may include one or more portions or areas in which air movement (such as by fan 130 or another air moving device) is minimal or substantially non-existent. In such implementations, these areas that experience minimal or no airflow may experience minimal or no convective heat transfer of heat generated by the processor 120, the memory 125, and/or other computing devices via a cooling airflow. In some implementations, all or substantially all of the board 115 and/or server rack assembly 110 may experience minimal or substantially no convective heat transfer via a cooling airflow over a middle portion of the board 115. For example, while cooling airflow may be circulated over or past one or more edges of the motherboard 115, minimal or no airflow may be circulated over heat-generating devices mounted at or towards the middle area of the board 115.

Figure 2A:
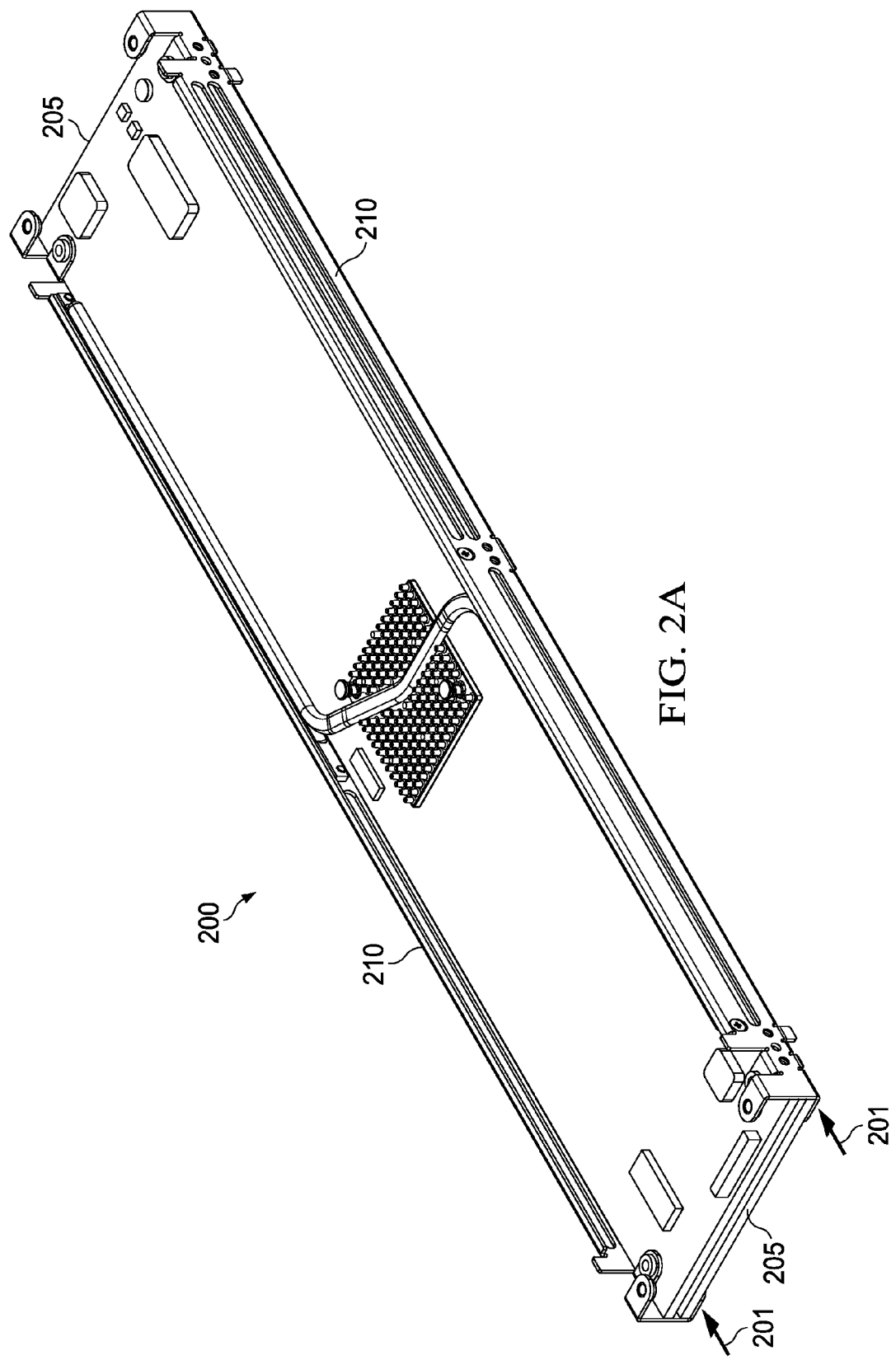
FIGS. 2A-2C illustrate top and bottom views of one example implementation of a server rack sub-assembly including a thermal transfer system in accordance with the present disclosure.
Figure 2B:
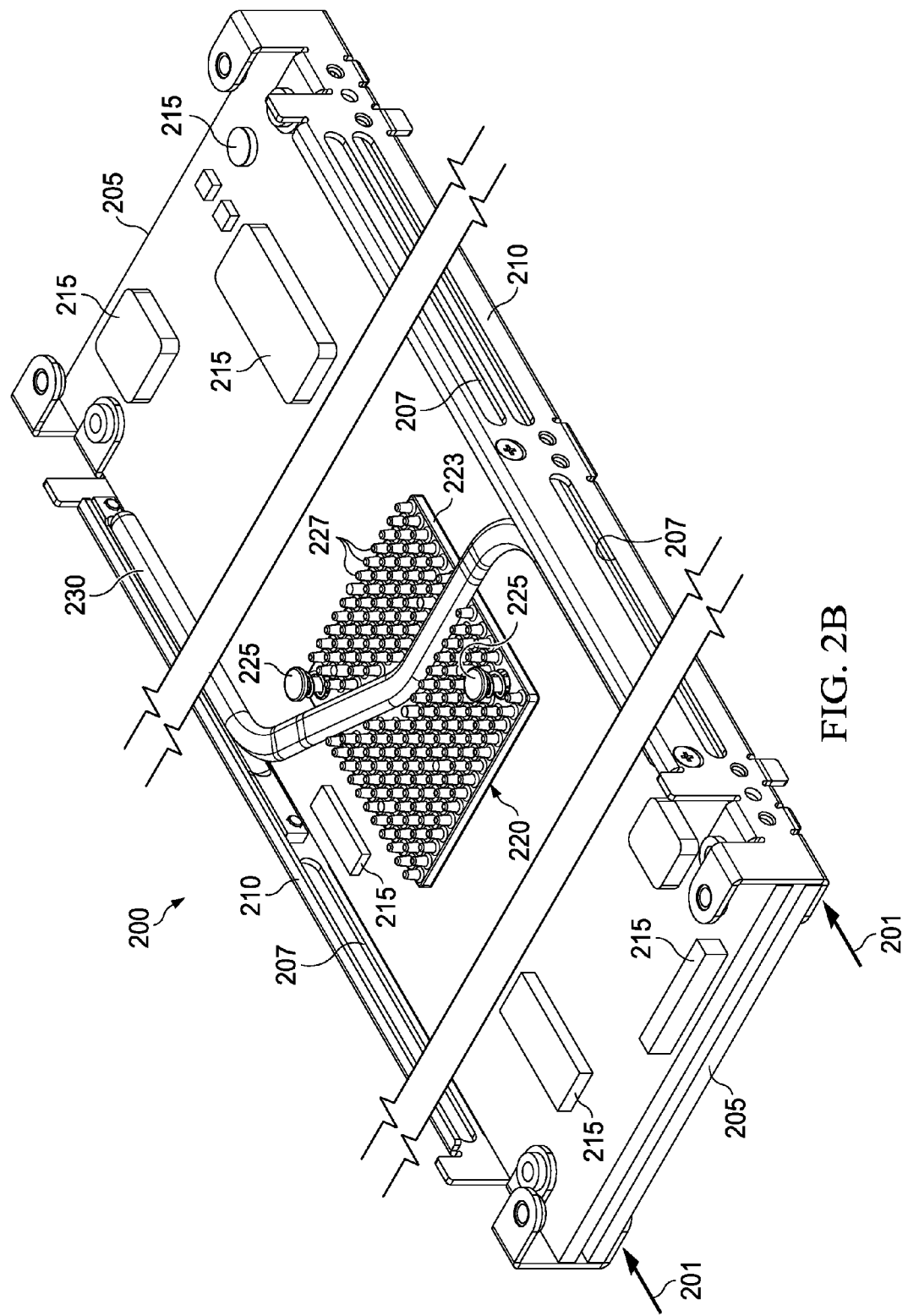
Figure 2C:
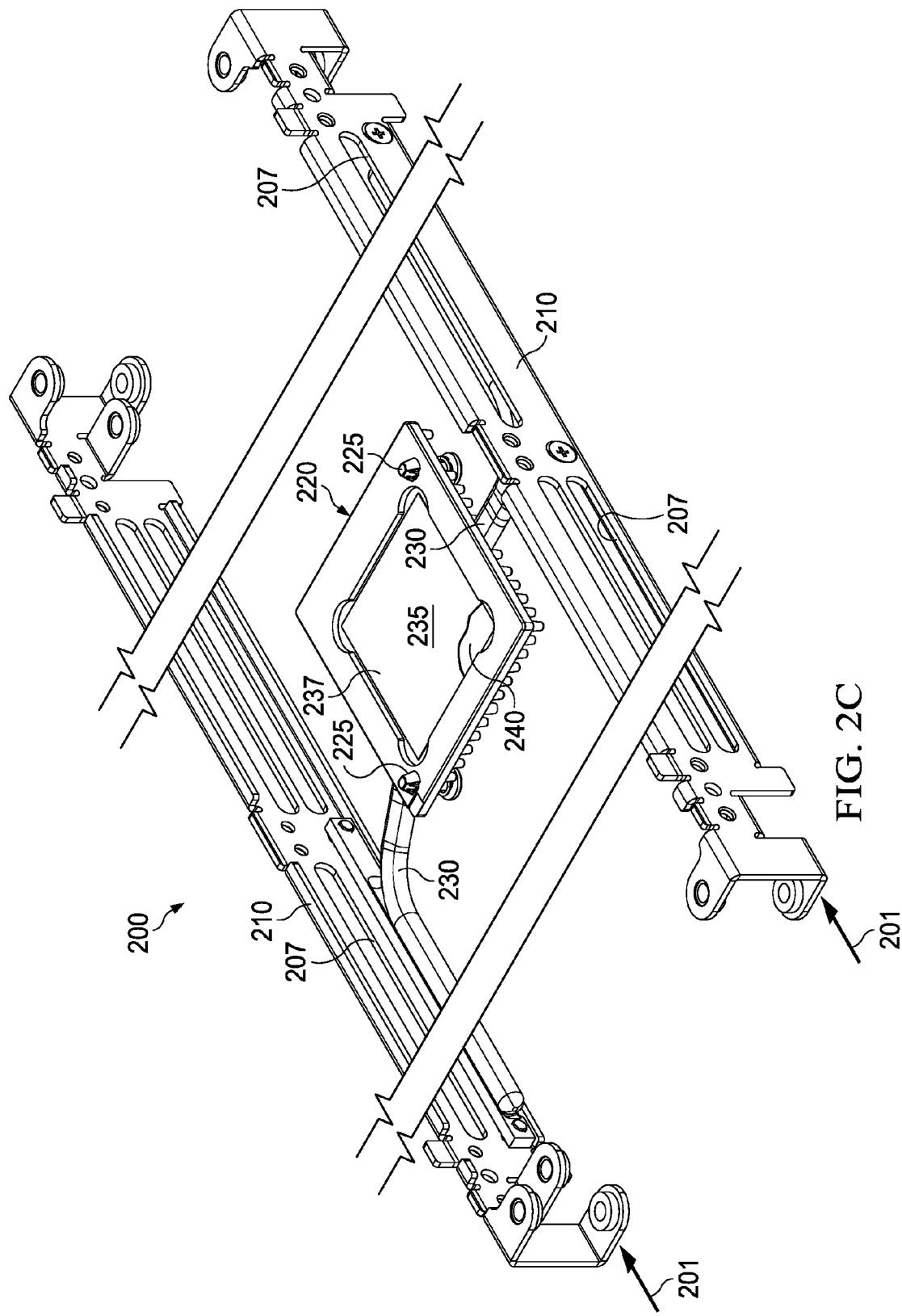

FIGS. 2A-2C illustrate top and bottom views of one example implementation of a server rack sub-assembly 200 including a thermal transfer system. The server rack sub-assembly 200, in some implementations, may be one of several sub-assemblies, or alternatively the only sub-assembly, mounted on the server rack assembly 110 illustrated in FIG. 1 and configured to slide into one of the slots 107 in the server rack 105. Alternatively, server rack sub-assembly 200 may itself be configured to slide into one of the slots 107 in the server rack 105 adjacent one or more other server rack sub-assemblies 200 and/or server rack assemblies 110.

Typically, the server rack sub-assembly 200 houses one or more electronic devices 215 mounted on a motherboard 205 that facilitate data processing, data storage, network communication, or any other computing functionality and/or environment. Such devices 215 may generate heat during their operation, such as heat generated due to electrical inefficiencies of the devices 215. Electronic devices 215 may be mounted to the motherboard 205 (e.g., circuit card or PCB, field programmable gate array (FPGA)) through any appropriate techniques. Although FIG. 2B illustrates a single motherboard 205, multiple motherboards 205 may be mounted together with electronic devices 215 mounted thereon. In some implementations, one or more structural components of the server rack sub-assembly 200 may function as a heat sink and, for example, may work in conjunction with heat sink 220 thermally coupled to the sub-assembly 200.

Server rack sub-assembly 200 also includes brackets 210 that are mounted on one or more edges of the motherboard 205. In some instances, the brackets 210 may be configured to couple two or more motherboards 205 together. For example, as illustrated, the brackets 210 may include space for three motherboards 205 to be coupled thereto, thereby providing a supporting structure for mounting the motherboards 205 to, for example, the server rack assembly 110. Additionally, the brackets 210 may facilitate or help facilitate installation of the server rack sub-assembly 200 into the server rack 105. In some implementations, additional components, such as one or more rails (not shown) may be mounted to the brackets to help facilitate installation of the server rack sub-assembly 200 onto the server rack assembly 110 and/or into the server rack 105.

In some implementations, the brackets 210 may provide structural stability or rigidity to the server rack sub-assembly 200. For example, the brackets 210 may provide the structural components to physically couple the heat sink 220, the motherboards 205, a heat pipe 230 and/or combinations of some of these components of the server rack sub-assembly 200. In addition, the brackets 210 may provide the structural components to physically couple the server rack sub-assembly 200 to, for example, the server rack assembly 110 and/or corresponding structures in the server rack 105. Moreover, in some implementations, the brackets 210 may be a heat sink component or a portion of a heat sink component that conducts heat from one or more of the electronic devices 215. For example, in some implementations, the brackets 210 may be integral with all or a portion of the a heat sink component that is in direct contact with a motherboard and/or electronic components on a motherboard.

In some implementations, the brackets 210 may be made of aluminum, copper, or other material which has good thermal conductivity. For example, one or more of the brackets 210, when installed as part of the server rack sub-assembly 200 and installed in the server rack 105, may be located within a cooling airflow circulated within the server rack 105. In some implementations, the cooling airflow (such as cooling airflow 201 illustrated in FIG. 2B) may be circulated over the brackets 210 only without being circulated over other portions of the server rack sub-assembly 200.

The heat sink 220 may be mounted to the motherboard 205 via one or more retainers 225. In some implementations, the retainers 225 may be inserted through one or more apertures of the heat sink 220 aligned with one or more apertures through the board 205. For instance, in some implementations, the heat sink 220 may be mounted to the board 205 by depressing the retainers 225 through the corresponding apertures aligned through the board 205 and the heat sink 220. By mounting the heat sink 220 to the motherboard 205, physical contact between the heat sink 220 and board 205, and/or the heat sink 220 and at least some of the electronic devices 215, may be created. Alternatively, installation of the heat sink 220 to the board 205 may provide for a small or slight air gap between a bottom portion of the heat sink 220 (shown in FIG. 2C) and the board 205. This air gap may be filled in to create contact between the heat sink 220 and the board 205 and/or devices 215 through, for example, a thermal interface as shown in FIG. 2C and discussed in more detail below.

As illustrated, the motherboard 205 is mounted to the brackets 210 at four separate locations via mechanical fasteners. However, motherboard 205 may be mounted to the brackets 210 at any number of locations, at locations different than those shown in FIGS. 2A-2C, and by mounting techniques different or in addition to those illustrated. In addition, while the motherboard 205 is illustrated as being mounted to the brackets 210 at or near the four corners of the board 205, the motherboard 205 may extend past the brackets 210 lengthwise, such that the brackets 210 are coupled to the board 205 at or near a middle portion of the board 205, but do not extend to an end of the board 205. In addition, in some implementations, the motherboard 205 may be part of a sub-assembly (like the server rack sub-assembly 200) in which the board 205 is not mounted to any brackets. Instead, in these alternative implementations, the motherboard 205 may be mechanically coupled to the server rack sub-assembly 200 (or a tray such as the server rack assembly 110, or a server rack structure such as the server rack 105).

One or more brackets 210 may include one or more apertures 207. Apertures 207 may help facilitate attachment and/or coupling of the server rack sub-assembly 200 to a server rack assembly 110 and/or one or more rails (not shown) used to facilitate installation of the server rack sub-assembly 200 into the server rack 105 and/or into a server tray. Additionally, in some implementations, apertures 207 may serve to increase a heat transfer area of the bracket 210 as cooling air 201 is passed over the bracket 210. For example, as convective heat transfer between the bracket 210 and the cooling airflow is directly related to a surface area of the bracket 210 exposed to the cooling airflow, increasing such area of the bracket 210 by forming one or more apertures 207 in the bracket 210 may increase the convective heat transfer from the bracket 210 to the airflow (such as airflow 201).

The server rack sub-assembly 200 also includes a heat sink 220 mounted to the motherboard 205 via one or more retainers 225. Heat sink 220, as illustrated, includes a planar portion 223 on which multiple fins 227 are integrally mounted thereon. In addition, heat sink 220 is in physical contact with at least a portion of the board 205 and/or at least some of the electronic devices 215 (as described further herein). For example, with specific reference to FIG. 2C, a bottom side of the heat sink 220 is illustrated, including the planar portion 223 and a thermal interface 235. In the illustrated implementation of FIG. 2C, for example, the planar portion 223 may be substantially planar with a recessed area or cutout on a bottom side of the portion 223. A top side of the planar portion 223 (shown in FIG. 2B) may be substantially flat. In other words, while portion 223 of the heat sink 220 is substantially planar, at least some of the portion 223 may be recessed.

Thermal interface 235, generally, facilitates or helps facilitate physical contact between the heat sink 220 and the motherboard 205 and/or one or more heat generating components on the motherboard 205. In some implementations, the thermal interface 235 includes a film 237 covering a thermal material 240. The thermal material 240 may, in some implementations, be a phase-change material such that as a temperature of the material 240 increases, the material 240 changes phase (e.g., solid to liquid, solid to near liquid, solid to semi-solid, and otherwise). As the thermal material 240 changes phase, for example, due to heat generated by one or more electronic devices 215 and conducted to the heat sink 220, the thermal material 240 may flow towards the board 205 and/or electronic devices 215 in order to increase a contact area between the film 237 and the board 205 (e.g., by filling in an air gap between the board 205 and the heat sink 220 and/or filling in an irregular surfaces of the board 205 (or devices 215) and/the heat sink 220).

In some alternative implementations, the thermal material 240 may flow to fill in small imperfections (e.g., irregularities and/or roughened surfaces) between a base of the heat sink 220 and an outer covering (i.e., outer surface of one or more electronic devices 215). For example, the air gap between the board 205 and electronic devices 215, or one of the board 205 or a portion of the electronic device 215, may be microscopic. For instance, the air gap may be due to surface imperfections on the heat sink 220 and the board 205 and/or the electronic devices 215.

In some implementations, the thermal interface 235 may not include the film 237. In such implementations, the thermal material 240 may flow to directly contact the board 205. For example, the thermal material 240, as it changes phase to a liquid and/or a semi-solid material, may create an adhesive interface between the heat sink 220 and the board 205.

As physical contact is made and/or increased between the heat sink 220 and the motherboard 205 (or electronic devices 215), heat generated by the electronic devices 215 may be conductively transferred to the heat sink 220 via the thermal interface 235. Thus, heat generated by the electronic devices 215, which may or may not have a cooling airflow 201 circulated over such devices 215, may be removed or partially removed from the devices 215 to the heat sink 220.

The server rack sub-assembly 200 includes a heat pipe 230 mounted to the heat sink 220 and the brackets 210. Heat generated by the electronic devices 215 transferred to the heat sink 220 may be transferred to the heat pipe 230. Heat pipe 230, for example, may utilize heat transfer via conduction and phase transition of a working material (e.g., a fluid like a liquid or gas, or a gel, or other material) within the heat pipe 230 to transfer heat from the heat sink 220 to one or more of the brackets 210. For instance, at an interface between the heat sink 220 and the heat pipe 230, a working material within the pipe 230 (e.g., water, liquid helium, mercury, sodium, indium, ammonia, alcohol, or otherwise) that is in thermal contact with an outer surface of the pipe 230 receives transferred heat from the heat sink 220 and evaporates. In some implementations, the portion of the heat pipe 230 in which the working material evaporates may be an evaporator section.

The evaporated working material of the heat pipe 230 may travel (e.g., via pressure and/or thermal gradients) from a middle portion of the heat pipe 230 to ends of the heat pipe 230 mounted to the brackets 210. As the evaporated working material nears such ends of the heat pipe 230 in contact with the brackets 210 (which are at a lower temperature than the evaporated working material due to, for example, the cooling airflow 201), it condenses back into a liquid, thereby releasing the heat transferred from the heat sink 220 to the brackets 210. In some implementations, the portion of the heat pipe 230 in which the working material condenses may be an condenser section. In condensed form, the working material may then move back towards the middle portion of the heat pipe 230 (e.g., by pressure gradients, temperature gradients, and or by gravitational force) and the above-described heat transfer cycle may be repeated. In some implementations, the heat pipe 230 may be a thermosiphon.

As such, a thermal circuit may exist such that heat energy travels from the electronic devices 215 and/or motherboard 205 to the thermal interface 235 of the heat sink 220, from the thermal interface 235 to the planar portion 223 of the heat sink 220, from the planar portion 223 to the heat pipe 230 and thus to the working material of the heat pipe 230, and from the working material to the brackets 210. In such fashion, heat generated by components on the server rack sub-assembly 200 that may experience minimal or no cooling airflow convection heat transfer may be transferred to one or more components, such as brackets 210, that experience convection heat transfer due to cooling airflow 201. Thus, the components of the server rack sub-assembly 200 within the thermal circuit may define a thermal transfer system for use with the server rack sub-assembly 200. Alternatively, a heat transfer device may be utilized in place of the heat pipe 230 in order to transfer heat generated by the electronic devices 215, and conductively transferred to the heat sink 220, to the brackets 210.

Figure 3:
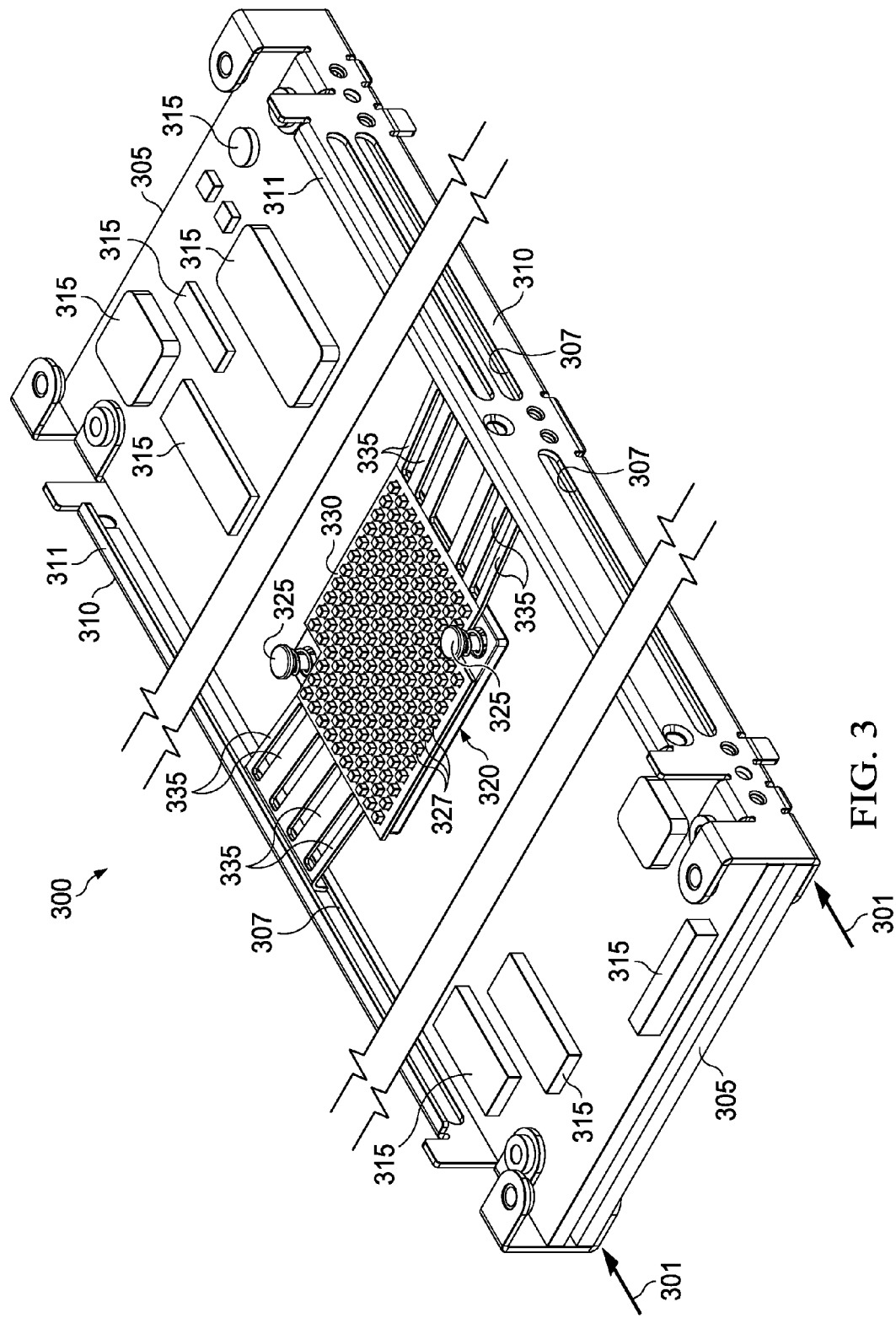
FIG. 3 illustrates a top view of another example implementation of a server rack sub-assembly including a thermal transfer system in accordance with the present disclosure.

FIG. 3 illustrates a top view of another example implementation of a server rack sub-assembly 300 including a thermal transfer system. The server rack sub-assembly 300, in some implementations, may be substantially similar to the server rack assembly 110 illustrated in FIG. 1 and configured to slide into one of the slots 107 in the server rack 105. Alternatively, the server rack sub-assembly 300 may be coupled and/or attached to one or more server rack assemblies 110 illustrated in FIG. 1. Alternatively, server rack sub-assembly 300 may itself be configured to slide into one of the slots 107 in the server rack 105 adjacent one or more other server rack sub-assemblies 300, server rack sub-assemblies 200, and/or server rack assemblies 110. For instance, server rack sub-assembly 300 may be used in place of, or in addition to, server rack sub-assembly 200 in server rack 105.

Typically, the server rack sub-assembly 300 has one or more electronic devices 315 mounted on a motherboard 305 that facilitate data processing, data storage, network communication, or any other computing functionality and/or environment. Such devices 315 may generate heat during their operation, such as heat generated due to electrical inefficiencies of the devices 315. Electronic devices 315 may be mounted to the motherboard 305 (e.g., circuit card or PCB, field programmable gate array (FPGA)) through any appropriate techniques. Although FIG. 3 illustrates a single motherboard 305, multiple motherboards 305 may be mounted together with electronic devices 315 mounted thereon.

Server rack sub-assembly 300 also has brackets 310 mounted on one or more edges of the motherboard 305. In some instances, the brackets 310 may be configured to couple two or more motherboards 305 together. Additionally, the brackets 310 may facilitate or help facilitate mounting of the server rack sub-assembly 300 to a server rack assembly 110 (shown in FIG. 1) and/or installation of the server rack sub-assembly 300 into the server rack 105. In some implementations, additional components, such as one or more rails (not shown) may be mounted to the brackets to help facilitate installation of the server rack sub-assembly 300 onto the server rack assembly 110 and/or into the server rack 105.

In some implementations, the brackets 310 may be made of aluminum, copper, or other material which has good thermal conductivity. For example, one or more of the brackets 310, when installed as part of the server rack sub-assembly 300 and installed in the server rack 105, may be located within a cooling airflow circulated within the server rack 105. In some implementations, the cooling airflow (such as cooling airflow 301 illustrated in FIG. 3) may be circulated over the brackets 310 only without being circulated over other portions of the server rack sub-assembly 300.

The heat sink 320 may be mounted to the motherboard 305 via one or more retainers 325. In some implementations, the retainers 325 may be inserted through one or more apertures of the heat sink 320 aligned with one or more apertures through the board 305. For instance, in some implementations, the heat sink 320 may be mounted to the board 305 by depressing the retainers 325 through the corresponding apertures aligned through the board 305 and the heat sink 320. By mounting the heat sink 320 to the motherboard 305, physical contact between the heat sink 320 and board 305 (and/or heat sink 320 and electronic devices 315) may be created. Alternatively, installation of the heat sink 320 to the board 305 may provide for a small or slight air gap between a bottom portion of the heat sink 320 and the board 305 (or devices 315). This air gap may be filled in to create contact between the heat sink 320 and the board 305 (or devices 315) through, for example, a thermal interface 235 as shown in FIG. 2C.

As illustrated, the motherboard 305 is mounted to the brackets 310 at four separate locations via mechanical fasteners. However, motherboard 305 may be mounted to the brackets 310 at any number of locations, at locations different than those shown in FIG. 3, and by mounting techniques different or in addition to those illustrated. In addition, while the motherboard 305 is illustrated as being mounted to the brackets 310 at or near the four corners of the board 305, the motherboard 305 may extend past the brackets 310 lengthwise, such that the brackets 310 are coupled to the board 305 at or near a middle portion of the board 305.

One or more brackets 310 may include one or more apertures 307. Apertures 307 may help facilitate attachment and/or coupling of the server rack sub-assembly 300 to a server rack assembly 110 and/or one or more rails (not shown) used to facilitate installation of the server rack sub-assembly 300 into the server rack 105. Additionally, in some implementations, apertures 307 may serve to increase a heat transfer area of the bracket 310 as cooling air is passed over the bracket 310. For example, as convective heat transfer between the bracket 310 and the cooling airflow 301 is directly related to a surface area of the bracket 310 exposed to the cooling airflow, increasing such area of the bracket 310 by forming one or more apertures 307 in the bracket 310 may increase the convective heat transfer from the bracket 310 to the airflow 301. Further, in some implementations, the one or more apertures 307 may facilitate or help facilitate airflow to certain portions of the server rack sub-assembly 300, such as a middle portion of the motherboard 305.

The server rack sub-assembly 300 has a heat sink 320 mounted to the motherboard 305 via one or more retainers 325. Heat sink 320, as illustrated, includes a planar portion 323 on which multiple fins 327 are integrally mounted thereon. In addition, heat sink 320 is in physical contact with at least a portion of the board 305 (described with reference to FIGS. 2A-2C above).

As physical contact is made and/or increased between the heat sink 320 and the motherboard 305 (and/or one or more heat generating components on the motherboard 305), heat generated by the electronic devices 315 may be conductively transferred to the heat sink 320 via a thermal interface, such as a thermal interface similar to thermal interface 235, as shown in FIG. 2C. Thus, heat generated by the electronic devices 315, which may or may not have a cooling airflow 301 circulated over such devices 315, may be removed or partially removed from the devices 315 to the heat sink 320.

The server rack sub-assembly 300 may provide for a thermal mesh 330 mounted to the heat sink 220 and the brackets 210. As illustrated, the thermal mesh 330 is installed over one or more of the fins 327 of the heat sink 320 such that the mesh 330 is in at least thermal communication with the heat sink 320 via the planar portion 323 and/or the fins 327. For example, the thermal mesh 330 may be configured and installed to rest on the planar portion 323 of the heat sink 320. In addition, the thermal mesh 330 includes one or more wings 335 extending from a grid portion of the mesh 330 and configured to be coupled to the brackets 310. For example, in some implementations, the wings 335 may be formed with an edge 337 to fit under, and be held in place by, a lip 311 on each bracket 310. The lips 311 may constrain the wings 335 and thus constrain the thermal mesh 330 onto the heat sink 320 even without mechanical or adhesive fastening techniques applied between the wings 335 and the lips 311.

Figure 4:
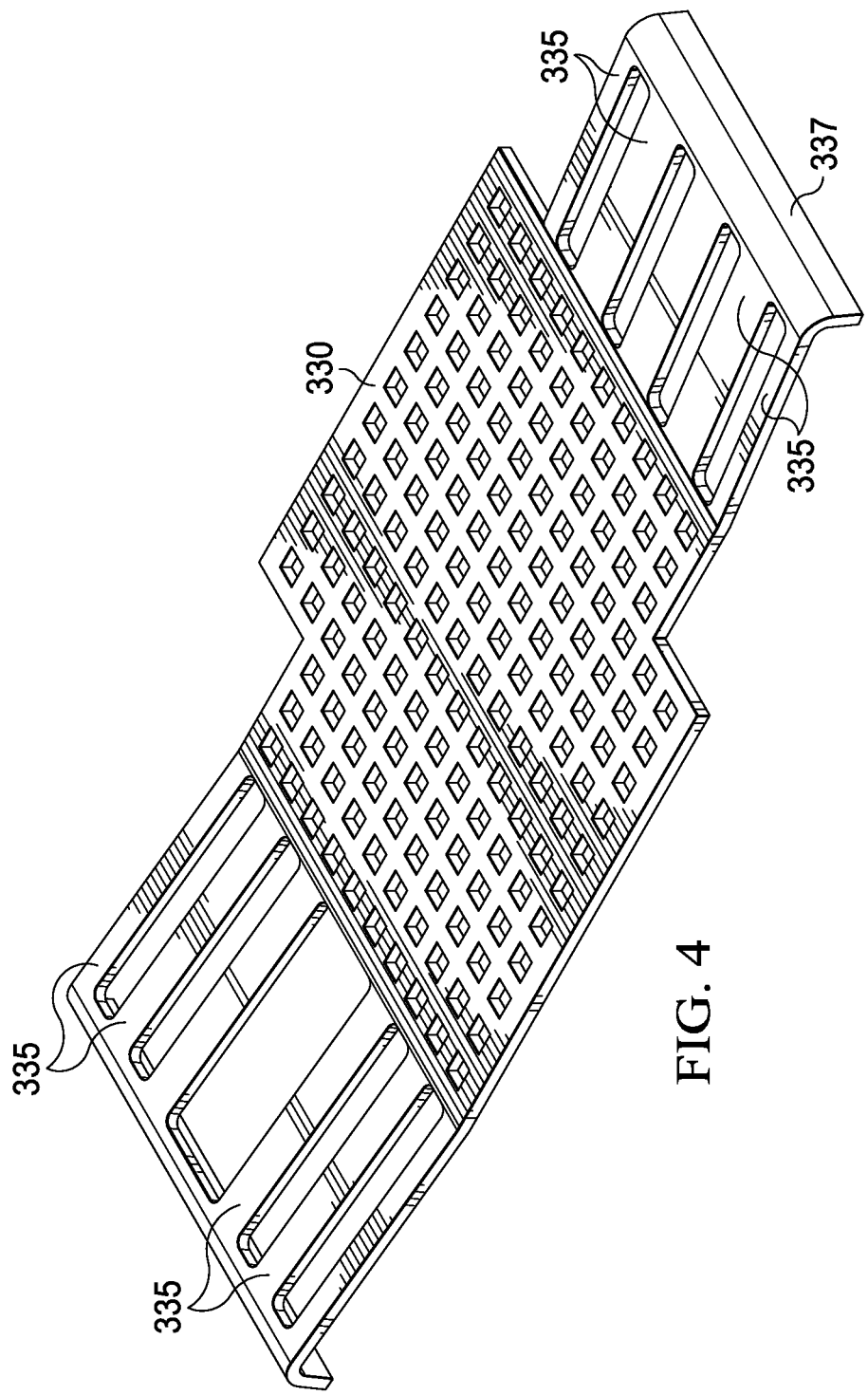
FIG. 4 illustrates one example implementation of a heat transfer device that may be used in a thermal transfer system of a server rack sub-assembly in accordance with the present disclosure.

In the illustrated implementation of FIG. 3, the wings 335 may be in the form of thermally conductive strips of material (e.g., aluminum and/or copper) that are adhered to or integral with the thermal mesh 330. In the forms of strips, the wings 335 may have greater flexibility and thus, a greater spring force. For example, as shown in FIG. 4, the thermal mesh 330 may include a curvature such that edges of the mesh 330 from which the wings 335 extend curve upward. In such implementations, when the wings 335 are constrained by the lips 311 of the brackets 310, a downwardly directed force may be applied to the wings 335. When such force, F, is applied, the thermal mesh 330 may be urged downward to create more physical contact between the mesh 330 and the planar portion 323 of the heat sink 320. Further, in some implementations, the thermal mesh 330 may also have a slight interference fit with the heat sink 220 in order to increase a contact force between the fins 327 and the mesh 330.

Heat that is generated by the electronic devices 215 and transferred to the heat sink 220 may be further transferred to the thermal mesh 330. Thermal mesh 330 may conduct such heat through the wings 335 and to the brackets 310 that are in thermal contact with the wings 335. As such, a thermal circuit may exist such that heat energy travels from the electronic devices 315 and/or motherboard 305 to a thermal interface (if provided) of the heat sink 320, from the thermal interface to the planar portion 323 of the heat sink 320, from the planar portion 323 to the outer thermal mesh 330, from the thermal mesh 330 through the wings 335, and from the wings 335 to the brackets 310. In such fashion, heat that may be generated by components on the server rack sub-assembly 300 that may experience minimal or no cooling airflow convection heat transfer may be transferred to one or more components, such as brackets 310, that experience convection heat transfer due to cooling airflow 301. Thus, the components of the server rack sub-assembly 300 within the thermal circuit may define a thermal transfer system for use with the server rack sub-assembly 300.

A number of implementations have been described. Nevertheless, it will be understood that various modifications may be made. For example, in some implementations, the wings 335 may facilitate convective heat transfer from the thermal mesh 330 as cooling airflow 301 is circulated over the brackets 310 and at least portions of the wings 335. In addition, in some implementations, fins 227 and/or fins 327 may facilitate convective heat transfer from heat sinks 220 and 320, respectively, to cooling airflow 301. Fins 227 and/or fins 327 may also facilitate conductive heat transfer from heat sinks 220 and 320, respectively, air that is stationary around and adjacent the fins. Accordingly, other implementations are within the scope of the following claims.

What is claimed is:

1. A server rack sub-assembly, comprising:
    at least one motherboard having a perimeter;
    a plurality of heat-generating electronic devices mounted on the motherboard in an area of the motherboard that is substantially thermally decoupled from the motherboard perimeter;
    an airflow pathway thermally separated from the area of the motherboard that is substantially thermally decoupled from the motherboard perimeter, that is defined along opposed sides of the perimeter of the motherboard from a first edge of the motherboard to a second edge of the motherboard;
    one or more brackets comprising heat transfer surfaces and attached to the motherboard within the airflow pathways, the one or more brackets adapted to couple the motherboard to a server rack assembly, the one or more brackets positioned in the airflow pathway to receive a cooling airflow that is circulated within the server rack sub-assembly over the one or more brackets without circulating over the area of the motherboard that is substantially thermally decoupled from the motherboard perimeter; and
    a heat transfer device thermally arranged to conductively transfer heat from the one or more electronic devices to the brackets, at least a portion of the heat transfer device including the one or more brackets.

2. The server rack sub-assembly of claim 1, further comprising a heat sink mounted on the motherboard in the area of the motherboard that is substantially thermally decoupled from the motherboard perimeter, the heat sink thermally coupled to the area of the motherboard and the heat transfer device.

3. The server rack sub-assembly of claim 2, wherein the heat sink comprises a thermal interface between at least a portion of the plurality of heat-generating electronic devices and a planar portion of the heat sink, the thermal interface adapted to increase contact between the portion of the plurality of heat-generating electronic devices and the heat sink as a temperature of the heat sink increases.

4. The server rack sub-assembly of claim 3, wherein the thermal interface comprises a phase-change material enclosed against the planar portion of the heat sink by a film, the phase-change material adapted to change from a substantially solid material to a semi-solid or liquid material as the temperature of the heat sink increases.

5. The server rack sub-assembly of claim 4, wherein the changed phase-change material substantially fills an air gap between the portion of the plurality of heat-generating electronic devices and the heat sink.

6. The server rack sub-assembly of claim 4, wherein the changed phase-change material substantially fills an air gap between the motherboard and the heat sink.

7. The server rack sub-assembly of claim 1, wherein the heat transfer device comprises a heat pipe enclosing a working material.

8. The server rack sub-assembly of claim 7, wherein the heat pipe further comprises an evaporator and at least one condenser, the evaporator thermally coupled to the area of the motherboard thermally decoupled from the perimeter, the condenser thermally coupled to one or more of the brackets.

9. The server rack sub-assembly of claim 7, wherein the working material is adapted to receive the heat generated by the electronic devices and transfer the heat to the one or more brackets.

10. The server rack sub-assembly of claim 1, wherein the one or more brackets are adapted to couple at least three motherboards to the server rack assembly.

11. A method for cooling electronic equipment, comprising: providing at least one server rack sub-assembly, comprising:
    at least one motherboard;
    one or more brackets coupled to the motherboard within airflow pathways that extend along opposed sides of a perimeter of the motherboard between a first edge of the motherboard and a second edge of the motherboard, the one or more brackets adapted to couple the motherboard to a server rack assembly; and
    a plurality of heat-generating computing devices mounted on the motherboard in an area that is substantially thermally decoupled from the airflow pathways;
    circulating an airflow through the airflow pathways and over the one or more brackets without circulating the airflow over the area that is substantially thermally decoupled from the airflow pathways;
    conductively transferring heat generated by the plurality of computing devices mounted on the substantially thermally decoupled area to the one or more brackets; and
    convectively transferring the generated heat from the one or more brackets to the cooling airflow.

12. The method of claim 11, further comprising:
    conductively transferring heat generated by the plurality of computing devices mounted on the substantially thermally decoupled area to a heat sink mounted on the motherboard in the area thermally decoupled from the perimeter; and conductively transferring the heat from the heat sink to the brackets.

13. The method of claim 12, further comprising:
conductively transferring heat generated by the plurality of computing devices mounted on the substantially thermally decoupled area to the heat sink through a thermal interface between the heat sink and the motherboard, the thermal interface comprising a phase-change material.

14. The method of claim 11, wherein conductively transferring heat generated by the plurality of computing devices mounted on the substantially thermally decoupled area to the one or more brackets comprises conductively transferring heat generated by the plurality of computing devices mounted on the substantially thermally decoupled area to the one or more brackets with a heat pipe thermally coupled to the motherboard and the one or more brackets, the heat pipe comprising a working material enclosed in an evaporator in fluid communication with a condenser.

15. The method of claim 14, further comprising:
transferring the generated heat from the plurality of computing devices mounted on the substantially thermally decoupled area to the working material within the evaporator; and
transferring the generated heat from the working material to the one or more brackets.

16. A system comprising:
a server rack assembly;
a server rack sub-assembly, comprising:
  at least one motherboard having a perimeter;
  an airflow pathway defined along opposed sides of the perimeter of the motherboard from a first edge of the motherboard to a second edge of the motherboard;
  a plurality of heat-generating electronic devices mounted on the motherboard in an area of the motherboard that is substantially thermally decoupled from the airflow pathway;
  one or more brackets coupling the server rack sub-assembly to the server rack assembly, the one or more brackets comprising heat transfer surfaces and attached to the motherboard within the airflow pathway, the one or more brackets positioned in the airflow pathway to receive a cooling airflow that is circulated within the server rack sub-assembly over the one or more brackets without circulating over the area of the motherboard that is substantially thermally decoupled from the airflow pathway; and
  a heat transfer device coupled to the area of the motherboard that is substantially thermally decoupled from the motherboard perimeter, the heat transfer device arranged to conductively transfer heat from the one or more electronic devices to the one or more brackets.

17. The system of claim 16, further comprising a heat sink thermally coupled between the area of the motherboard that is substantially thermally decoupled from the motherboard perimeter and the heat transfer device.

18. The system of claim 16, further comprising one or more fans positioned to circulate a cooling airflow across the heat transfer surfaces to convectively remove heat from the heat transfer surfaces.

19. The system of claim 16, wherein the heat transfer device is a heat pipe.

* * * * *